US 7,257,000 B2

(12) United States Patent
Pfahnl et al.

(10) Patent No.: US 7,257,000 B2
(45) Date of Patent: Aug. 14, 2007

(54) THERMALLY ENHANCED PRESSURE REGULATION OF ELECTRONICS COOLING SYSTEM

(75) Inventors: Andreas C. Pfahnl, Goffstown, NH (US); Peter Griffith, Belmont, MA (US)

(73) Assignee: Amphenol Corporation, Wallingford, CT (US)

( * ) Notice: Subject to any disclaimer, the term of this patent is extended or adjusted under 35 U.S.C. 154(b) by 26 days.

(21) Appl. No.: 10/886,449

(22) Filed: Jul. 7, 2004

(65) Prior Publication Data

US 2006/0007657 A1 Jan. 12, 2006

(51) Int. Cl.
*H05K 7/20* (2006.01)
(52) U.S. Cl. ............... 361/700; 361/699; 257/715; 165/104.21; 165/104.33
(58) Field of Classification Search ......... 361/699, 361/700, 711; 174/15.1, 15.2; 257/714, 257/715; 165/80.3, 104.21, 104.33
See application file for complete search history.

(56) References Cited

U.S. PATENT DOCUMENTS

| | | | |
|---|---|---|---|
| 3,512,582 A | 5/1970 | Chu et al. | |
| 5,121,788 A | 6/1992 | Carollo | |
| 5,144,531 A | 9/1992 | Go et al. | |
| 5,206,791 A * | 4/1993 | Novotny | 361/700 |
| 5,216,580 A * | 6/1993 | Davidson et al. | 361/700 |
| 5,316,077 A | 5/1994 | Reichard | |
| 5,323,847 A | 6/1994 | Koizumi et al. | |
| 5,731,954 A | 3/1998 | Cheon | |
| 5,941,300 A | 8/1999 | Colling et al. | |
| 5,986,882 A | 11/1999 | Ekrot et al. | |
| 5,999,403 A | 12/1999 | Neustadt | |
| 6,151,210 A | 11/2000 | Cercioglu et al. | |
| 6,166,907 A | 12/2000 | Chien | |
| 6,191,945 B1 | 2/2001 | Belady et al. | |
| 6,234,240 B1 | 5/2001 | Cheon | |
| 6,313,990 B1 | 11/2001 | Cheon | |
| 6,317,320 B1 | 11/2001 | Cosley et al. | |
| 6,351,381 B1 | 2/2002 | Bilski et al. | |
| 6,490,160 B2 * | 12/2002 | Dibene et al. | 361/700 |
| 6,504,719 B2 | 1/2003 | Konstad et al. | |
| 6,519,955 B2 | 2/2003 | Marsala | |
| 6,587,343 B2 | 7/2003 | Novotny et al. | |
| 6,608,752 B2 * | 8/2003 | Morris et al. | 361/700 |
| 6,695,039 B1 * | 2/2004 | Reyzin et al. | 165/104.21 |
| 6,763,880 B1 | 7/2004 | Shih | |
| 6,840,311 B2 * | 1/2005 | Ghosh et al. | 165/104.33 |
| 6,917,522 B1 * | 7/2005 | Erturk et al. | 361/700 |

(Continued)

OTHER PUBLICATIONS http://www.lytron.com/standard/es_mod_pics.htm; Mar. 3, 2004; pp. 1-2; Lytron Cooling System.

(Continued)

*Primary Examiner*—Boris Chervinsky
(74) *Attorney, Agent, or Firm*—Blank Rome LLP (57) ABSTRACT

A two-phase cooling system operated at atmospheric pressure. A reservoir containing cooling fluid has a stack that is vented to the atmosphere. The stack is shaped to allow condensation of substantially all of the cooling fluid in vapor form entering the stack. Condensation may be enhanced by cooling the stack, such as with flowing air along the outer walls of the stack or placing a thermoelectric device in contact with the stack. The system provides high thermal capacity but is easy to use and service.

27 Claims, 6 Drawing Sheets

U.S. PATENT DOCUMENTS

| | | | |
|---|---|---|---|
| 7,154,749 B2* | 12/2006 | Stefanoski et al. | ......... 361/695 |
| 2004/0008483 A1 | 1/2004 | Cheon | |
| 2004/0050231 A1 | 3/2004 | Chu et al. | |
| 2004/0057211 A1 | 3/2004 | Kondo et al. | |
| 2004/0250992 A1 | 12/2004 | Aoki et al. | |
| 2005/0133214 A1 | 6/2005 | Pfahnl | |

OTHER PUBLICATIONS http://www.lytron.com/standard/es_mod_pics.htm; Mar. 3, 2004; pp. 1-2; Lytron specialized cooling systems, liquid cooling and modular cooling systems.

http://www.koolance.com/products/product.html?code=RMI1-2U &category_id=2; Mar. 3, 2004; pp. 1-2; Koolance-Superior Liquid Cooling Solutions.

http://www.koolance.com/products/product.html?code=EXT-A04 &category_id=2; Mar. 3, 2004; pp. 1-2; Koolance-Superior Liquid Cooling Solutions.

http://www.spraycool.com/About/howSpray/Works.gif; Sep. 3, 2004; pp. 1-11.

Thesis by Avram Markowitz, "Boiling and Condensation in a Liquid-Filled Enclosure", MIT Library, Feb. 25, 1971; pp. i-107.

US 6,236,957, 07/2001, Chen et al. (withdrawn)

* cited by examiner

THERMALLY ENHANCED PRESSURE REGULATION OF ELECTRONICS COOLING SYSTEM

BACKGROUND OF INVENTION

1. Field of Invention

This invention relates generally to electronic systems and more particularly to cooling systems for use in electronic systems.

2. Discussion of Related Art

Electronic systems contain components that consume power, much of which is dissipated as heat. For many electronic systems, the packaging density of the electronic components is low enough that the heat generated as the system operates can be dissipated into the air surrounding the electronic system. For systems that dissipate large amounts of power as heat or that are packaged into smaller areas, cooling fans are often used. The fans enhance the airflow across hot components to increase the rate at which heat is dissipated into the air.

As the heat density of electronics systems increases, either because the components in the system generate more heat or because the components are packaged into smaller areas, air cooling is not able to keep the electronic system operating in a desired temperature range. To provide greater cooling, some systems have used water or other fluids with a higher specific heat than air. In such systems, a cold plate is often positioned next to electronic components that generate substantial heat. The cooling fluid circulates through passages in the cold plate. The temperature of the fluid increases as it absorbs heat from the electronic components. The fluid is circulated to a heat exchanger away from the electronic circuitry. The heat exchanger is used to dissipate the heat from the fluid into the air. The cooled fluid is then recirculated through the cold plate, where it again absorbs heat from the electronic components. An example of such a system is given in co-pending U.S. patent application Ser. No. 10/741,542, filed on Dec. 19, 2003 and entitled MODULAR RACKMOUNT CHILLER (now U.S. patent application publication 2005/0133214), which is hereby incorporated by reference.

The fluid temperature of the before-mentioned cooling system will depend on the heat load. As a result, the fluid expands and contracts. If the system is left freely vented to the outside atmosphere, fluid loss will result. Therefore these types of cooling systems are typically sealed from the outside to minimize fluid loss due to these thermal expansion effects, and also due to direct evaporation if it were left freely venting to the outside ambient environment. However, to avoid excessive pressures in the system, a pressure-relief valve is used to limit the pressure in the system typically to about 10 psig at the tank location. When the system vent opens, vapor and entrapped air escape. As a result of the pressure-relief valve, the undesirable loss of fluid is reduced but not eliminated. In addition, a vacuum-relief valve is used to limit the minimum pressure to about −5 psig.

Such cooling systems in which heat is removed from a system by a temperature increase of a fluid are often called single-phase cooling systems, where the heat removed based on a temperature change is called sensible heat. The amount of heat removed by a single-phase system depends on the mass flow rate of the cooling fluid, its specific heat capacity, and its allowable temperature rise. There are practical limits on the sensible heat removal in a cooling system and also on the rate of flow of such fluids.

Where greater cooling than can be provided with a single-phase system is desired, two phase cooling systems are sometimes used. In a two-phase system, the cooling fluid is allowed to boil or evaporate. The fluid thus undergoes a phase change. When a fluid changes its state from a liquid to a vapor, it absorbs heat in proportion to a material property known as the "latent heat of vaporization" of the material. The latent heat is generally much larger than the sensible heat. Thus, by allowing some or all of the cooling fluid to undergo a phase change, the amount of heat removed from the electronic system can be greatly increased or the mass flow rate of the fluid can be greatly reduced, allowing for a smaller cooling system.

Most two-phase cooling systems are closed loop systems, meaning that the vapor from the cooling fluid is condensed back to a liquid and recirculated for further cooling of the electronic system. Most closed loop cooling systems therefore include a condenser or other form of heat exchanger. An example of a closed loop two phase cooling system is described in U.S. Pat. No. 6,519,955 to Marsala, which is hereby incorporated by reference.

We have recognized a drawback in using available two phase closed loop cooling systems with electronic systems. Electronic systems are often assembled from printed circuit boards or other subassemblies that are plugged into a rack or similar structure. A backplane or other interconnection structure makes the electrical connection between the printed circuit boards. For liquid cooling, a cold plate is often attached to each printed circuit board. A manifold or other fluid distribution network built into the card cage runs fluid to and from the cold plates. Quick disconnect couplings are often used to connect the cold plates on the printed circuit boards to the fluid distribution manifold. Quick disconnect couplings provide an easy way to connect or disconnect the cold plates to the fluid distribution system when inserting or removing printed circuit boards or other assemblies.

While quick disconnect couplings are generally reliable, they inherently release a small amount of fluid each time a printed circuit board is removed, and inject a small amount of air each time a printed circuit board is inserted. Over time, the loss of cooling fluid and the introduction of air into a sealed cooling system can become a significant problem. For a two phase cooling system to work properly, some portion of the cooling fluid must always be in a liquid state. Otherwise, no liquid is available to absorb heat through a phase change and the electronic system will likely overheat.

The presence of air in a two phase cooling system, even when sufficient cooling fluid is available in its liquid state, can also lead to significant problems. Air is considered a "non-condensable" and impedes heat transfer particularly in the condenser component of a two-phase cooling system. Further, the addition of non-condensables increases the pressure within the fixed-size closed-loop cooling system. The two-phase cooling system maintains the electronics at a temperature proportional to the boiling point of the cooling fluid. Boiling point is directly related to the pressure in the system. As the amount of non-condensables in the sealed system increases, the boiling point of the cooling fluid therefore increases. Thus as air is introduced into the closed loop cooling system, the operating temperature of the electronic devices increases. If sufficient air is introduced into the cooling system, the electronic system may reach a temperature that is outside its acceptable operating range.

To avoid problems caused by the introduction of air, conventional two-phase cooling systems are hermetically sealed and do not allow fluid lines to be repeatedly connected and disconnected. The consequence on usage for cooling electronics is that to remove a printed circuit card the cold plates must now be detached. This results in a very lengthy and cumbersome process because of the number of required fasteners involved with cold plate attachments, requirements for the proper application of the thermal interface material that resides between the cold plate and the electronics components, and the precision alignment requirements.

A means to allow for the use of cold plate would be to utilize a pressure-relief valve that vents any excessive pressure due to induced air to the outside atmosphere. The drawback just as before for single-phase cooling systems is that a mixture of air and vapor will leave the system rather than solely the undesired air. The negative consequence is that the fluid amount will decrease over time.

SUMMARY OF INVENTION

It is an object of the invention to provide an improved cooling system, such as might be used in connection with an electronic system. More specifically, the improvement is achieved by thermally enhancing the pressure regulation system of a single- or two-phase cooling system.

One embodiment of the invention is directed to a cooling system comprising a reservoir to hold cooling fluid, a stack coupled to the reservoir to allow gas to exit the reservoir, and means for cooling the stack.

Another embodiment of the invention is directed to a cooling system comprising a reservoir to hold cooling fluid and a stack comprising walls that define first and second openings. The first opening of the stack is coupled to an opening of the reservoir such that gas may enter the stack from the reservoir via the first opening and exit the stack via the second opening. The stack is constructed and arranged such that substantially all cooling fluid evaporated in the gas is condensed onto the walls of the stack before the gas exits the stack.

A further embodiment of the invention is directed to a cooling system comprising a reservoir to hold cooling fluid, a stack coupled to the reservoir, and at least one valve coupled to the stack. The at least one valve is responsive to a pressure difference between the reservoir and the ambient environment, thereby regulating the pressure within the reservoir. The stack comprises walls that define first and second openings, wherein the first opening is coupled to an opening of the reservoir. A length of the stack is more than ten times greater than a diameter of the second opening.

Another embodiment of the invention is directed to a method of operating an electronic system comprising, dissipating power as heat in at least one electronic component and bringing a cooling fluid into thermal contact with the at least one electronic component. The cooling fluid has a boiling point above ambient temperature at atmospheric pressure. The method further includes equalizing the pressure of the cooling fluid with the ambient pressure by providing a path to the ambient environment and condensing substantially all of the cooling fluid in vapor form as it traverses the path towards the ambient environment.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Figure 1:
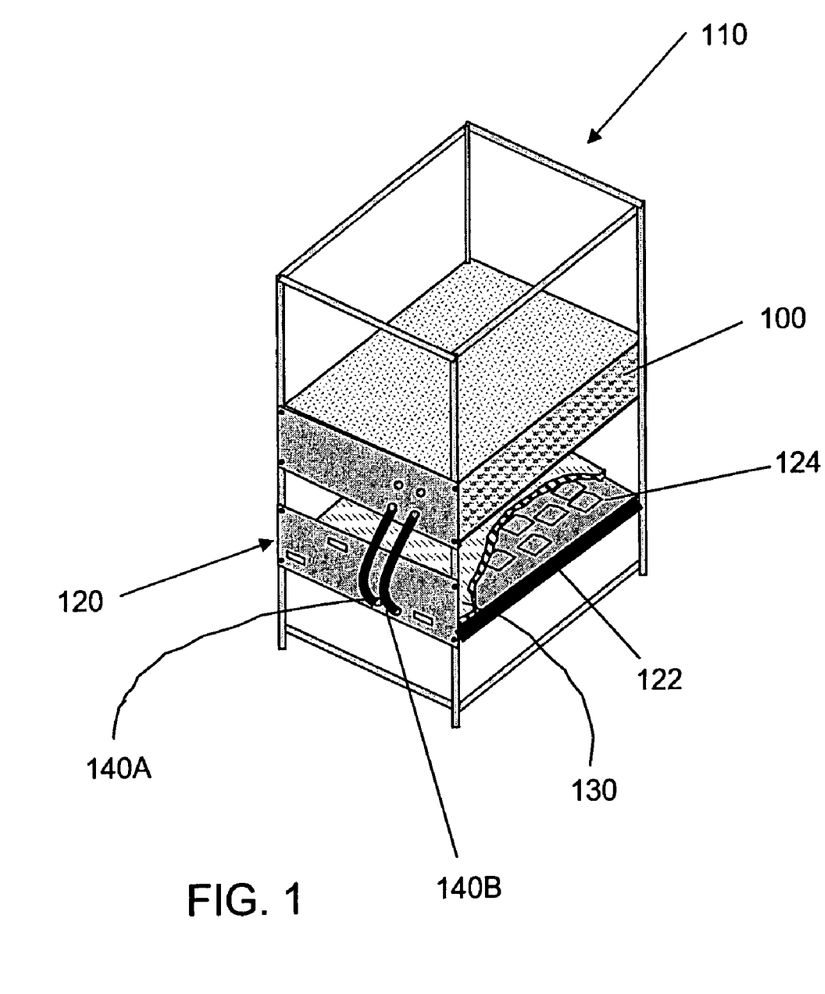
FIG. 1 is a simplified sketch of an electronic system employing a cooling system.

FIG. 1 is a sketch of an electronic assembly of the type commonly assembled in a rack 110. The rack 110 contains multiple slots into which subassemblies may be inserted. Electronic module 120 is an example of such a subassembly. Electronic module 120 includes a printed circuit board 122 with multiple electronic components, such as component 124, mounted to it. In operation the electronic components generate heat.

In the example of FIG. 1, a cold plate 130 is mounted over the components on printed circuit board 122. Cooling fluid (not shown) flows through hose 140A to carry cooling fluid to cold plate 130. Hose 140B removes the cooling fluid from cold plate 130 once it has absorbed heat from the electronic components 124.

In the embodiment of FIG. 1, chiller unit 100 is incorporated into rack 110. Chiller 100 includes a reservoir for the cooling fluid and also a heat exchanger. Preferably, hoses 140A and 140B are connected to chiller 100 and cold plate 130 with quick disconnect couplings.

Figure 2:
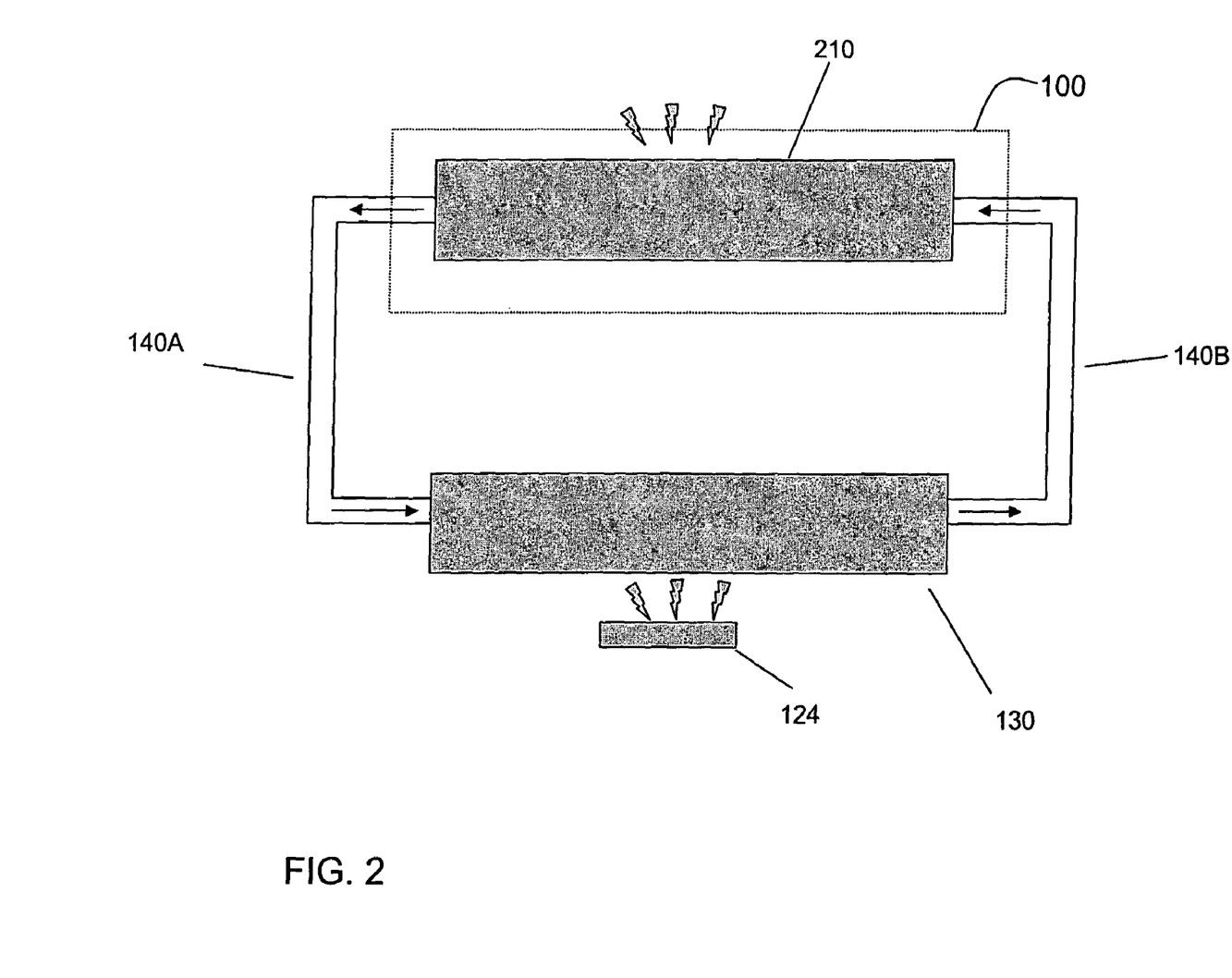
FIG. 2 is a schematic illustration of a cooling system.

FIG. 2 shows the flow of heat within the electronic assembly of FIG. 1. The heat is generated by components such as 124. The heat is absorbed by cold plate 130. Cooling fluid enters cold plate 130 through hose 140A. The cooling fluid absorbs heat within cold plate 130 and returns to chiller unit 100 through hose 140B.

Chiller 100 includes a heat exchanger 210. Heat exchanger releases heat into the air, cooling the cooling fluid. From heat exchanges 210, the cooling fluid may be recirculated through hose 140A to cold plate 130. A cooling system might also include other components, such as a tank to act as a reservoir for cooling fluid and a pump to circulate the fluid. Such components are not explicitly shown. In the described embodiment, the cooling system is a two phase cooling system. In the preferred embodiment, the system operates at or near atmospheric pressure. Preferably, the fluid is such that it boils below the intended operating temperature of electronic components 124. Further, the cooling fluid will preferably condense at a temperature that is higher than the ambient temperature at which electronic system employing the cooling system of the invention will operate. The cooling fluid enters cold plate 130 substantially in liquid form. Some or all of the cooling fluid is boiled in cold plate 130 such that the fluid within pipe 140B contains vapor. In this embodiment, heat exchanger 210 is a condenser, which condenses vapor back to a liquid form.

Figure 3:
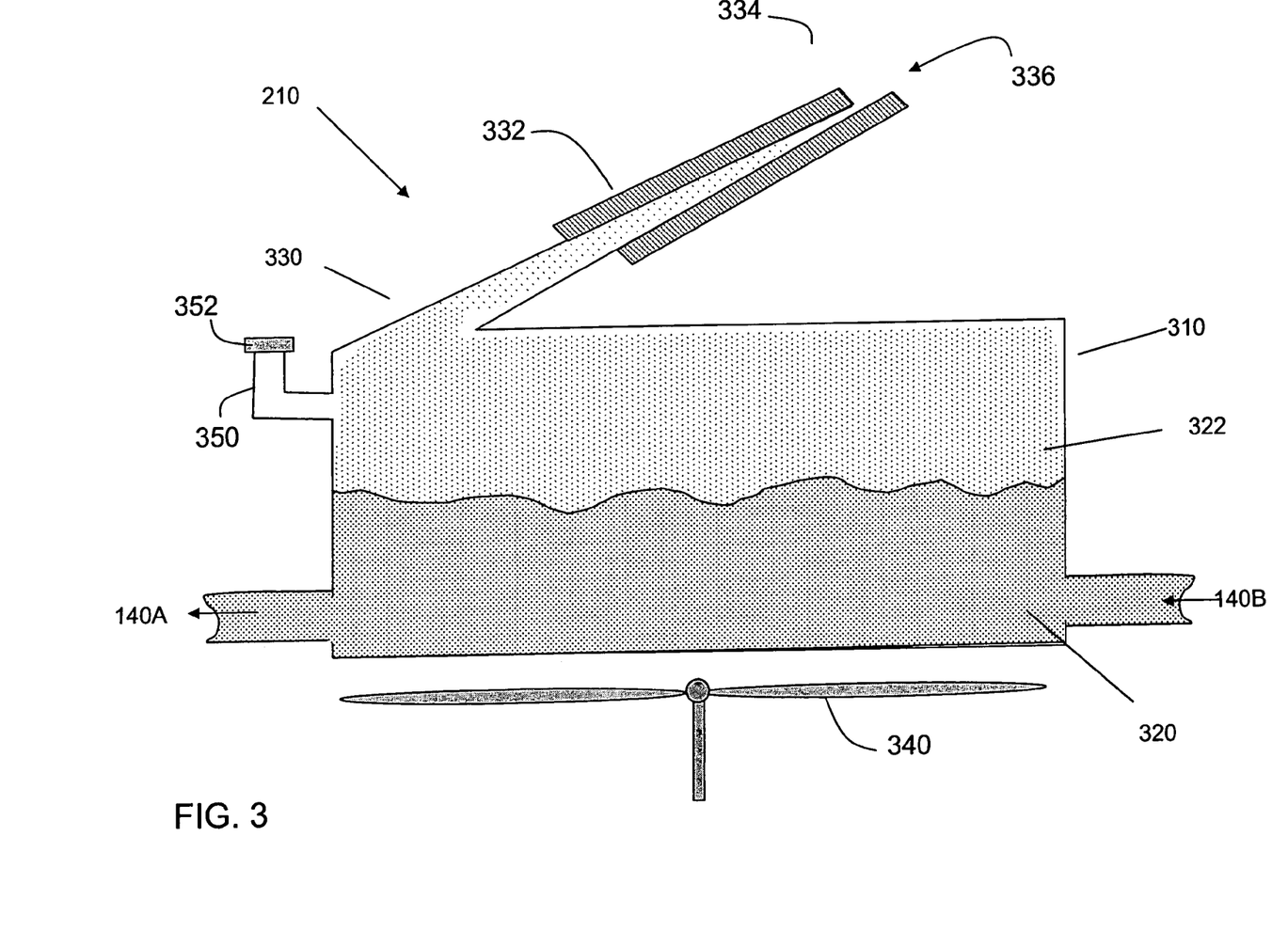
FIG. 3 is a cross-sectional view of an embodiment of the invention.

FIG. 3 shows a cross sectional view of a condenser according to an embodiment of the invention. Condenser 210 includes a reservoir 310. Cooling fluid leaves the reservoir 310 through a hose 140A.

The heated fluid, some of which may be a vapor, returns to reservoir 310 through pipe 140B. It is intended that the electronic system operate at a temperature that causes some of the cooling fluid to boil. Therefore, the fluid returning to reservoir 310 through pipe 140B adds to the liquid 320 and the vapor 322 within reservoir 310.

In the illustrated embodiment, a fan 340 blows air across reservoir 310 to aid in dissipating heat in the cooling fluid. Thin channels, fins or other structures might be included in reservoir 310 to enhance the transfer of heat from the fluid in reservoir 310.

As the vapor 322 within reservoir 310 cools, it condenses to become liquid 320. Condenser 210 may be constructed generally with materials and construction techniques as used in condensers known in the art. However, condenser 210 includes a stack 330 with an opening 336 exposed to the ambient atmosphere 334. Vent 336 ensures that the cooling system operates at ambient pressure.

To reduce the escape of cooling fluid, particularly in vapor form, stack 330 is made sufficiently long and opening 336 is made sufficiently small that substantially all of the vapor entering stack 330 will condense before reaching opening 336. Stack 330 is shown at an angle. This angle of stack 330 ensures that any vapor condensing on the inside surfaces of stack 330 will flow down stack 330 to reservoir 310. Stack 330 might be needle shaped, having a length of several inches (centimeters), such as 3 inches (7 centimeters) or more, to provide adequate surface area for the vapor to condense. Opening 336 might be approximately 5 millimeters or less, even as small a millimeter or less. In some embodiments, the opening is a "pinhole." The stack will preferably have a cross section, away from the opening, that is large enough to allow vapor to freely pass through it, such as on the order of 5 millimeters. According to one example, the length of the stack may more than ten times greater than the diameter of the opening, though in other examples, the length may be more than 50 times greater than the diameter and could be 100 times greater.

To further reduce the amount of cooling fluid escaping as vapor through opening 336, condenser 210 may include means for cooling stack 330. The means for cooling stack 330 may include any mechanism for maintaining the temperature of an inner surface of the stack 330 at or below a temperature at which evaporated fluid from reservoir 310 will condense thereon. Such means may include features of the stack 330 itself, such as protrusions or recesses to increase the surface area of the stack, or cooling devices such as fans or thermoelectric devices. The embodiment of FIG. 3 shows thermoelectric devices 332 attached to stack 330. Thermoelectric devices 332 are operated in a cooling mode. To avoid condensation of water from the air, thermoelectric devices 332 are operated to ensure the surface of the stack 330 stays above the ambient dew point. As an alternative or in addition to the use of thermoelectric devices, use of insulation could bring the surface of the stack 330 to a temperature below ambient temperature, further increasing the rate of condensation of any vapor within stack 330.

Because of the relatively thin dimensions of stack 330, very little energy need be used to cool stack 330. As a result of the enhanced cooling air will leave the system and virtually all cooling fluid in the vapor phase will condense to join liquid 320 in reservoir 310.

Figure 4:
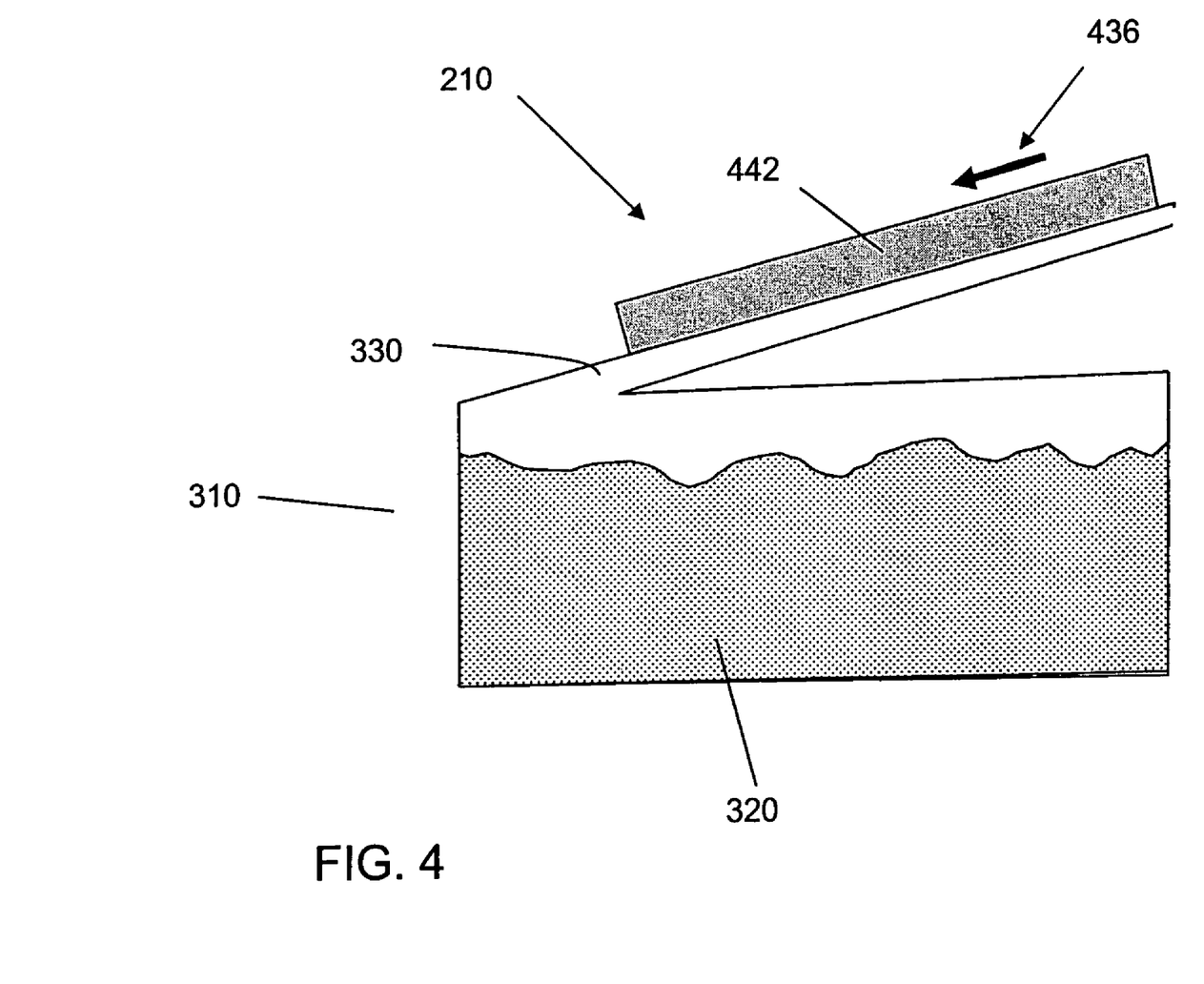
FIG. 4 is a cross-sectional view of an alternative embodiment of the invention.

FIG. 4 shows an alternative embodiment of the condenser 210. The condenser includes the same reservoir 310 holding cooling fluid 320. The condensation inside stack 330 is enhanced now with heat-transfer enhancing features such as extended surfaces (fins) 442 that are aligned with the axis of the stack 330. Further, a forced airflow 436 across fins 442 can be introduced to enhance the cooling.

Figure 5:
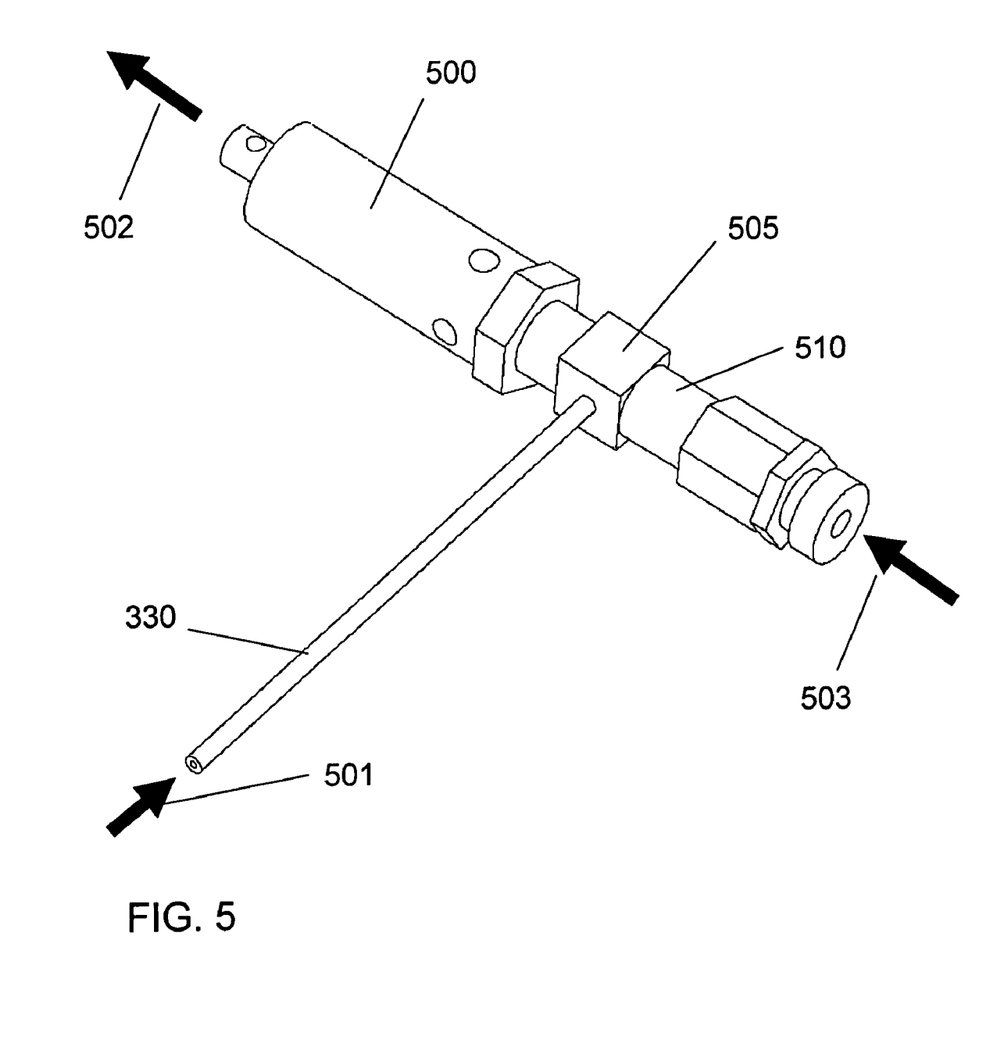
FIG. 5 is a sketch of an embodiment of a stack.
Figure 6:
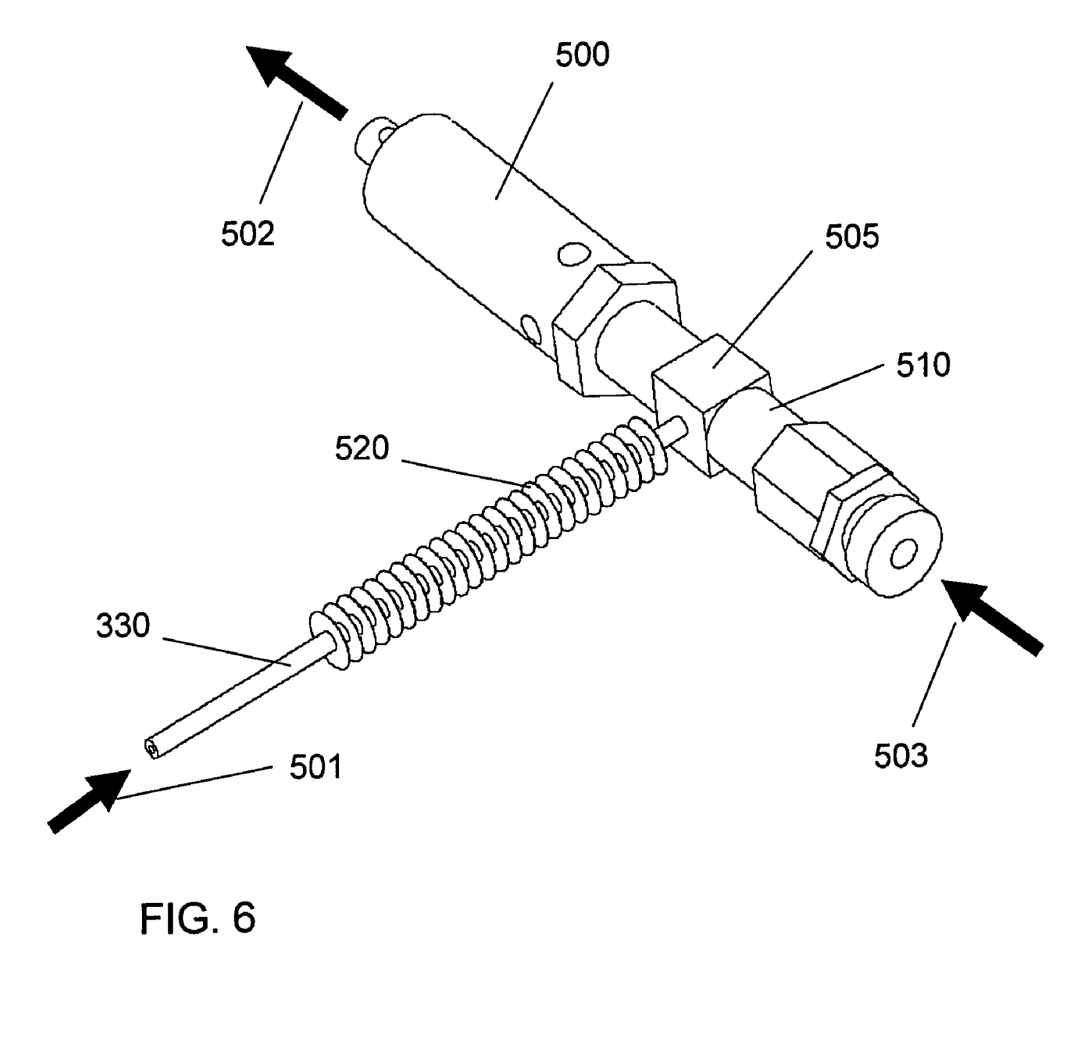
FIG. 6 is a sketch of an alternative embodiment of the stack of FIG. 5.

FIG. 5 and FIG. 6 illustrate another embodiment of just the stack utilizing pressure-relief and vacuum-relief valves mentioned earlier. In the embodiments illustrated in FIG. 3 and FIG. 4 there is direct communication between the inside of the system and the outside environment. FIG. 5 illustrates an embodiment in which further reductions in the vapor loss through stack 330 are achieved by attaching a pressure-relief valve 500 set to a relatively low positive pressure, generally no more than about 1 psig for two-phase cooling systems, and a vacuum relief valve 510 set to a relatively low negative pressure generally no more than about −1 psig for two-phase cooling systems to the end of stack 330. The setting levels may be significantly different for single-phase cooling systems. The two valves 500 and 510 can be coupled to stack 330 with a fitting 505.

Vapor, containing evaporated cooling fluid might enter stack 330 as shown at 501. When the pressure inside the cooling system increases, air might escape as shown at 502. When the inside the cooling system decreases, air might enter the system as shown at 503. The two valves operate together to keep the pressure within the system substantially at ambient pressure. However they restrict loss of cooling fluid when the system is not in operation.

FIG. 6 illustrates the use of condensation heat-transfer enhancing fins attached to the exterior of stack 330 this time aligned perpendicular to the axis of stack 330. In both of these embodiments of FIG. 5 and FIG. 6, the vapor-air mixture 501 enters stack 330. The vapor is then condensed on the inside walls of stack 330 whose angle of inclination helps return the condensed liquid into the reservoir 310. The remaining air 502 then leaves through the pressure-relief valve 500. A vacuum-relief valve 510 can also be used to limit the minimum pressure in the system. When actuated, the vacuum-relief valve 510 allows outside air 503 to enter the system.

Various fluids might be used for cooling fluid 320. For example, HFE-7100 might be used. This fluid has a boiling point of approximately 61 degrees centigrade at one atmosphere. Such a fluid would hold cold plate 130 (FIG. 1) at a temperature generally acceptable as an operating temperature for most electronic systems. In addition, HFE-7100 readily condenses at normal room temperatures. Preferably, whatever fluid is used is more dense than air, because using a fluid that is more dense than air will lead to a stratification, placing air above the cooling fluid, reducing the chance that cooling fluid might escape through the vent.

There are several advantages provided by the systems described above. Reservoir 310 is at atmospheric pressure, so that a small leak in the system does not necessarily lead to rapid fluid loss, which might cause a catastrophic failure of the cooling system, or the vaporization of the fluid contents for pressurized (greater than about 10 psig) two-phase systems. Further, if air or other non-compressibles are introduced into the cooling system, they do not increase the pressure of the system because vent 336 will ensure that the pressure inside the system remains at near-atmospheric pressure. When utilizing pressure-relief and vacuum-relief valves, the boiling temperature of a two-phase cooling system using HFE-7100 will change about 2 deg C. for 1 psig change in pressure, which is an acceptable boiling-temperature variation for electronics cooling.

As a further advantage, reservoir 310 may be easily refilled. FIG. 3 shows a fill pipe 350 connected to reservoir 310. Fill pipe 350 is capped with cap 352. Cap 352 can be removed for recharging reservoir 310 through fill pipe 350. Because reservoir 310 is at atmospheric pressure, no special procedures need be employed to recharge reservoir 310.

Having thus described several aspects of at least one embodiment of this invention, it is to be appreciated various alterations, modifications, and improvements will readily occur to those skilled in the art.

Various alternative applications and embodiments are possible. For example, it is not necessary that the cooling system be used in connection with a cold plate. Reservoir such as 310 or 410 might be placed directly on top of a component to be cooled with the cooling system. As an alternative, the component might be immersed totally or partially in the cooling fluid 320.

Also, FIG. 3 shows in schematic form the same structure acting as both a reservoir and condenser. These components might be implemented as separate structures. For example, a separate condenser might be employed with fins or other features to enhance the dissipation of heat.

Also, the fill cap and stack need not be part of the tank. These structures might be attached at any convenient point to the system.

Further, the vent described above is not limited to use in connection with two-phase cooling systems. It might for example be employed with a single phase system.

The embodiments described heat transfer enhancements applied to the external surfaces of the stack which can as well be applied to the inside surfaces of an appropriately sized stack.

Further, the invention is illustrated in connection with a rack mounted cooling system. However, the invention might be employed in any application in which cooling is desired.

Such alterations, modifications, and improvements are intended to be part of this disclosure, and are intended to be within the spirit and scope of the invention. Accordingly, the foregoing description and drawings are by way of example only.

What is claimed is:

1. A cooling system comprising:
a reservoir to hold cooling fluid;
a stack coupled to the reservoir to allow gas to exit the reservoir to the ambient environment; and
a means for cooling the stack.

2. The cooling system of claim 1, wherein the means for cooling the stack comprises means for cooling at least a portion of the stack to a temperature at or below the condensation temperature of the cooling fluid.

3. The cooling system of claim 1, wherein the means for cooling the stack comprises a thermoelectric device coupled to the stack.

4. The cooling system of claim 1, wherein the means for cooling the stack comprises one or more protrusions emanating from the stack.

5. The cooling system of claim 4, wherein the protrusions are fin-shaped.

6. The cooling system of claim 1, wherein the means for cooling the stack comprises a mechanism for directing airflow towards the stack.

7. The cooling system of claim 1, wherein the stack is configured and oriented such that condensation formed on the walls of the stack is directed towards the reservoir.

8. The cooling system of claim 1, wherein the stack includes a longitudinal axis extending therethrough, the reservoir includes a base, and the stack is oriented such that a plane occupied by the longitudinal axis of the stack forms an acute angle with a plane occupied by the base of the reservoir.

9. The cooling system of claim 1, further comprising: a cooling plate coupled to the reservoir via at least one fluid passage arranged to circulate fluid between the cooling plate and reservoir.

10. The cooling system of claim 1, further comprising means for cooling the reservoir.

11. A cooling system comprising:
a reservoir to hold cooling fluid; and
a stack comprising walls that define first and second openings, wherein the first opening of the stack is coupled to an opening of the reservoir such that gas may enter the stack from the reservoir via the first opening and exit the stack via the second opening;
wherein the stack is constructed and arranged such that substantially all cooling fluid evaporated in the gas condenses onto the walls of the stack before the gas exits the stack.

12. The cooling system of claim 11, wherein the second opening of the stack has a diameter equal to or less than approximately 5 millimeters.

13. The cooling system of claim 11, wherein the second opening of the stack has a diameter equal to or less than approximately 1 millimeter.

14. The cooling system of claim 13, wherein the stack has a length equal to or greater than approximately 7 centimeters.

15. The cooling system of claim 11, additionally comprises a cooling device in thermal contact with the stack and thermal insulation between the stack and the ambient environment.

16. A cooling system, comprising: a reservoir to hold cooling fluid;
a stack coupled to the reservoir, the stack comprising walls that define first and second openings, wherein the first opening is coupled to an opening of the reservoir, and wherein a length of the stack is more than ten times greater than a diameter of the second opening; and
at least one valve coupled to the second opening of the stack, the at least one valve being responsive to a pressure difference between the reservoir and the ambient environment, thereby regulating the pressure within the reservoir.

17. The cooling system of claim 16, the stack being adapted to promote condensation of evaporated cooling fluid and return the condensed cooling fluid to the reservoir.

18. The cooling system of claim 16, wherein the at least one valve comprises a first valve responsive to a pressure within the reservoir that is above a first predetermined level.

19. The cooling system of claim 18, wherein the at least one valve further comprises a second valve responsive to a pressure within the reservoir that is below a second predetermined level.

20. The cooling system of claim 16, further comprising means for cooling the stack.

21. The cooling system of claim 20, wherein the means for cooling the stack comprises means for cooling at least a portion of the stack to a temperature at or below the condensation temperature of the cooling fluid.

22. The cooling system of claim 20, wherein the means for cooling the stack comprises one or more protrusions emanating from the stack.

23. The cooling system of claim 22, wherein the protrusions are fin-shaped.

24. A method of operating an electronic system comprising,
   a) dissipating power as heat in at least one electronic component;
   b) bringing a cooling fluid into thermal contact with the at least one electronic component, the cooling fluid having a boiling point above ambient temperature at atmospheric pressure;
   c) equalizing the pressure of the cooling fluid with the ambient pressure by providing a path to the ambient environment; and
   d) condensing substantially all of the cooling fluid in vapor form as it traverses the path towards the ambient environment.

25. The method of claim 24, further comprising:
   e) recirculating condensed cooling fluid to dissipate power from the at least one electronic component.

26. The cooling system of claim 11, wherein the walls define a tube having a circular cross-section.

27. The cooling system of claim 11, wherein the stack is at the top of the reservoir.

* * * * *